US006915467B2

(12) United States Patent
Pilo

(10) Patent No.: US 6,915,467 B2
(45) Date of Patent: Jul. 5, 2005

(54) SYSTEM AND METHOD FOR TESTING A COLUMN REDUNDANCY OF AN INTEGRATED CIRCUIT MEMORY

(75) Inventor: Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 497 days.

(21) Appl. No.: 10/014,032

(22) Filed: Dec. 11, 2001

(65) Prior Publication Data

US 2003/0110424 A1 Jun. 12, 2003

(51) Int. Cl.[7] .............................................. G11C 29/00
(52) U.S. Cl. ....................................... 714/718; 365/201
(58) Field of Search .......................... 365/201; 714/710, 714/711, 718, 719, 703; 710/66, 307

(56) References Cited

U.S. PATENT DOCUMENTS

| 4,449,207 A | * | 5/1984 | Kung et al. ............ 365/189.02 |
| 5,257,229 A | | 10/1993 | McClure et al. |
| 5,299,161 A | | 3/1994 | Choi et al. |
| 5,355,340 A | | 10/1994 | Coker et al. |
| 5,502,676 A | | 3/1996 | Pelley, III et al. |
| 5,530,674 A | | 6/1996 | McClure et al. |
| 5,608,678 A | | 3/1997 | Lysinger |
| 5,673,227 A | | 9/1997 | Engles et al. |
| 5,677,881 A | | 10/1997 | Seo et al. |
| 5,708,612 A | * | 1/1998 | Abe ........................... 365/200 |
| 5,732,029 A | * | 3/1998 | Lee et al. .................... 365/200 |
| 5,809,225 A | | 9/1998 | Ohsawa et al. |
| 5,870,341 A | | 2/1999 | Lin et al. |
| 6,037,799 A | * | 3/2000 | McClure ...................... 326/37 |
| 6,111,800 A | | 8/2000 | Allan et al. |
| 6,122,194 A | | 9/2000 | Chung et al. |
| 6,144,593 A | | 11/2000 | Cowles et al. |
| 6,154,389 A | | 11/2000 | Chung et al. |
| 6,240,024 B1 | | 5/2001 | Taufique et al. |
| 6,269,035 B1 | | 7/2001 | Cowles et al. |
| 6,278,637 B1 | | 8/2001 | Kawaguchi |
| 6,490,210 B2 | * | 12/2002 | Takase et al. ............... 365/201 |

FOREIGN PATENT DOCUMENTS

| JP | 10050099 A | 9/1997 |
| JP | 10172294 | 6/1998 |

OTHER PUBLICATIONS

"A Redundancy Test–Time Teduction Technique in 1–Mbit DRAM with a Multibit Test Mode" by Nishimura et al. IEEE Journal o Solid–State Circuits, Feb. 1989 vol.: 24, Issue: 1 p. 43–49 Inspec Accession No.: 3375644.*
IBM Technical Disclosure Bulletin, vol. 34, No. 7B, Dec. 1991, Column Redundancy for Fast Memory Arrays.
IBM Technical Disclosure Bulletin, vol. 31, No. 10, Mar. 1989, Multiplexed Column Redundancy Method for Complementary Metal Oxide Silicon Memory
IEEE Xplore, A 3.3V 12 ns 16 Mb CMOS SRAM, 39th ISSCC, 1992 IEEE International, pp., 216–217, 288, Feb. 19–21, 1992,H. Goto et al., NEC Corp.
IEEE Xplore, An Approach to Testing 200 ps Echo Clock to Output Timing on the Double Data Rate Synchronous Memory, Test Conference 2000, Proceedings, International, pp. 610–618, 10/3–May 2000, Van Dinh, D.; Rabitoy, V.

* cited by examiner

*Primary Examiner*—Albert Decady
*Assistant Examiner*—Cynthia Britt
(74) *Attorney, Agent, or Firm*—H. Daniel Schnurmann

(57) ABSTRACT

A system and method is disclosed for simultaneously testing columns and column redundancies of a semiconductor memory by temporarily adding an additional parallel signal bit to an input/output data bus associated therewith, the additional parallel signal bit providing greater bandwidth during test mode operation. The input/output data bus has n parallel signal bits which normally carry column data, but the additional parallel signal bit does not normally carry either column data or column redundancy data. The additional parallel signal bit may normally carry a clock signal such as an echo clock associated with the data placed on the data bus.

16 Claims, 3 Drawing Sheets

SYSTEM AND METHOD FOR TESTING A COLUMN REDUNDANCY OF AN INTEGRATED CIRCUIT MEMORY

FIELD OF THE INVENTION

This invention relates to integrated circuit memories and more specifically to an integrated circuit memory, especially a dynamic random access memory (DRAM) in which one or more column redundancies are provided, and a test mode therefor.

BACKGROUND

Many integrated circuit memories, including DRAMs and DRAM macros embedded in logic integrated circuits (ICs), include column redundancies as available replacements for defective elements that lie anywhere along a column path from a memory array to a data bus. Thus, if a column fails for any reason, a test and repair procedure is used to replace the defective column with a column redundancy.

Column redundancies thus represent an excess in the number of available column data paths to a memory array over the number of data bits carried by an input/output data bus during normal operation. Since column redundancies are used in normal operation only if columns are determined to be defective, it is undesirable to provide complete parallel data paths for the redundancies to the exterior of the IC memory (such as to separate pins), or to the exterior of a memory macro, because of the additional IC area and external pins required.

At production test time for the IC memory or memory macro, it is necessary to test each of the columns of the memory array as well as the column redundancies to determine the existence of any defects therein. However, up to now, unless complete parallel data paths were provided from the memory array to the exterior of the IC or memory macro for these column redundancies, the column redundancies could not be tested in the same test pass as the regular columns of the memory array. Moreover, each test pass took significant time to complete because column operation had to be tested by individually cycling each wordline of the memory array on and off in sequence until the entire wordline space had been tested.

It would therefore be desirable to provide a way to test column redundancies in the same test pass of the memory array as regular columns, but without needing to provide separate complete data paths from memory array to the exterior. In this way, significant test time is saved without requiring the external input/output data buses or pin count to be enlarged.

SUMMARY

Accordingly, in an aspect of the invention, a method is provided for simultaneously testing columns and column redundancies of a semiconductor memory by temporarily adding an additional parallel signal bit to an input/output data bus associated therewith. The input/output data bus has n parallel signal bits which normally carry column data, but the additional parallel signal bit does not normally carry either column data or column redundancy data. According to a preferred aspect of the invention, the additional parallel signal bit normally carries a clock signal.

In a preferred aspect of the invention, a method is provided for simultaneously testing columns and column redundancies of a semiconductor memory which has a memory array. Such method includes normally providing m×n data bit access per transfer between a memory array and a data bus having n parallel signal bits having m burst bits each; and temporarily providing m×(n+1) data bit access per transfer during the testing, through n parallel signals and through an added parallel signal, to test m additional column redundancies simultaneously with the m×n columns, wherein the added parallel signal normally does not have a connection to a data path exterior to the memory array.

According to another aspect of the invention, a system is provided for simultaneously testing columns and column redundancies of a semiconductor memory. Such system includes an input/output data bus having n parallel signal bits which normally carry column data, and an additional parallel signal bit which normally carries a signal other than column data or column redundancy data. The additional parallel signal bit is adapted to be added temporarily to the input/output data bus during the testing, such that the n parallel signal bits and the additional parallel signal bit provide simultaneous access to column data and column redundancy data for testing.

DETAILED DESCRIPTION OF THE PREFERRED EMBODIMENTS

Figure 1:
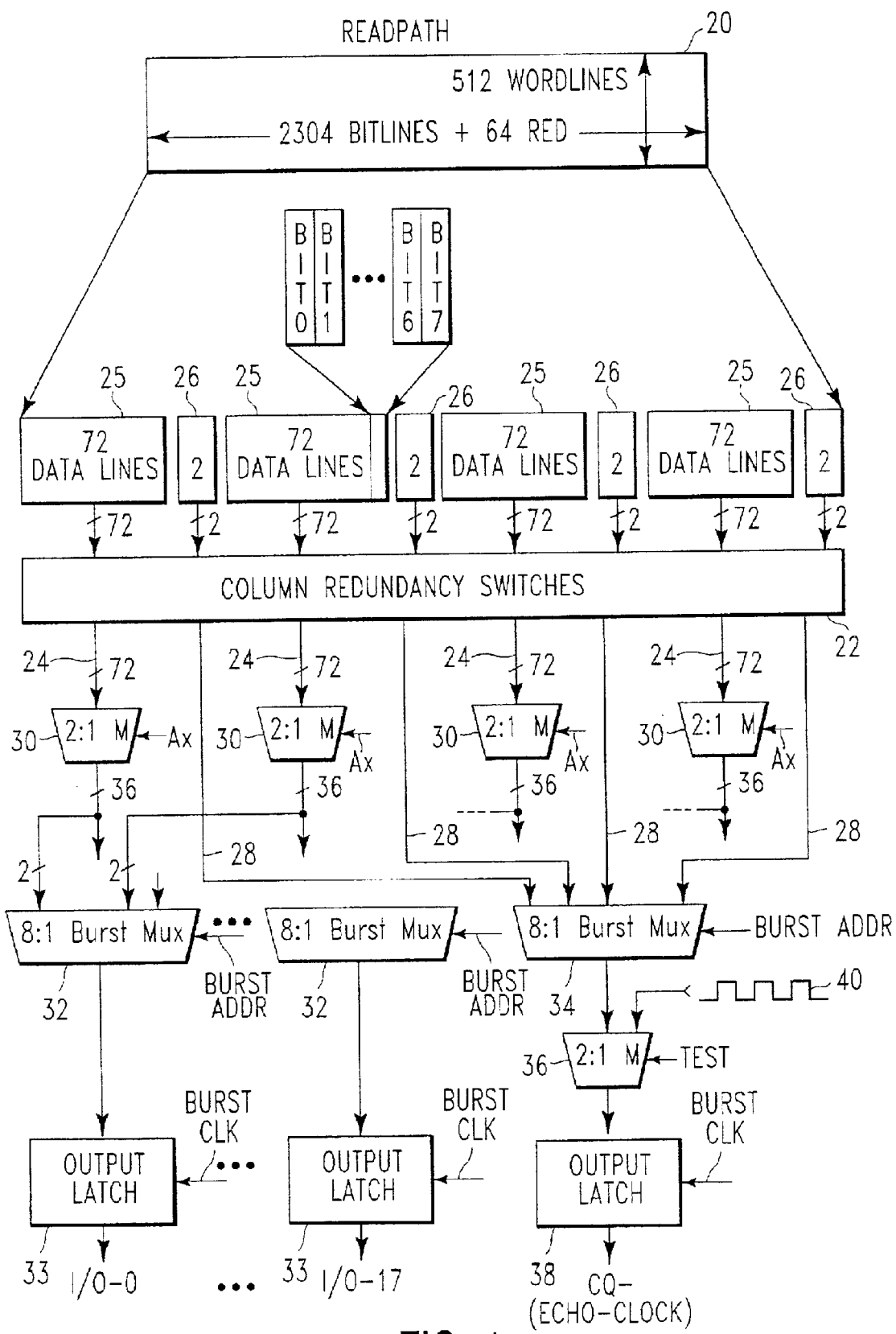
FIG. 1 is a block diagram illustrating a preferred embodiment of the invention, particularly with respect to the exercise of a read path.

FIG. 1 is a block diagram illustrating a preferred embodiment of the invention, as particularly illustrative of the exercise of a read path. As shown in FIG. 1, an exemplary memory array 20 is accessed over a space of 512 wordlines and 2304 bitlines plus 64 additional redundant bitlines. Each group of eight bitlines is multiplexed by secondary sense amplifiers over one data line of the array, such that array data is accessed on 2304/8=288 data lines. The 288 data lines are further grouped into four groups of 72 data lines each, with 2 column redundancies provided for each group of 72 data lines.

Column redundancy switches 22 are used during normal operation, as opposed to test mode operation, to provide 72 column data paths from among the available 72 data lines plus 2 column redundancies. It will be understood that none, one or two of the column redundancies can be switched into the 72 column data paths (referenced as 24) when the memory is repaired to replace defective columns, while the defective columns are switched out of the 72 column data paths. During test mode operation, the column redundancy switches 22 simply pass the 72 data lines to the 72 column data paths (24) and pass the two column redundancies (26) to two redundancy data paths (28).

The 72 column data paths (24) from each group are further connected to a 2:1 multiplexer 30 to provide 36 read data lines at the output. An address bit Ax serves as a select input to each multiplexer 30, of which there are four.

The memory is further provided with 18 burst multiplexers 32, each having an 8:1 serialization rate (8 parallel bits on input; an 8 bit serial burst of data on output). Each burst multiplexer 32 receives two bits output from each of the four 2:1 multiplexers 30. Each of the 18 burst multiplexers 32 are used during normal operation to provide read access to the memory array. A burst address (BURST ADDR), input to each burst multiplexer 32, controls the serial readout of data from each burst multiplexer 32. Eighteen output latches 33, each receiving the output of a burst multiplexer 32, place data on an eighteen bit parallel input/output data bus (referenced I/O-0 . . . I/O-17). A burst clock signal (BURST CLK), generated from a main clock (CLK_MAIN) (See FIG. 2 and accompanying description below) clocks the data onto the input/output data bus at a rate of two bits per cycle of CLK_MAIN.

An additional burst multiplexer 34 provides test mode data paths for the eight column redundancies 26 of the memory array during test mode operation only. This burst multiplexer 34 is not used during normal operation. All of the eight column redundancies are input to this burst multiplexer 34. The data from each column redundancy is output serially as a burst during test mode operation, simultaneously and in parallel with the serial data bursts being output by each of the 18 burst multiplexers 32.

The column redundancy data from burst multiplexer 34 is not output externally during normal operation of the semiconductor memory. During normal operation, output latch 38 outputs an echo clock signal CQ, which is a locally regenerated signal which represents the timing of data placed on the data bus (I/O-0 . . . I/O-17). The echo clock signal CQ is a regenerated version of a main clock signal CLK_MAIN which is input to the semiconductor memory. Thus, output latch 38 does not carry column data or column redundancy data during normal operation, but instead is used to carry the echo clock signal CQ.

During test mode operation, output latch 38 provides a data path for outputting column redundancy data. During test mode operation, eight bits of column redundancy data are passed serially from 8:1 burst multiplexer 34 through a 2:1 multiplexer to the output latch 38 when TEST signal is active at the select input to multiplexer 34. The column redundancy data is then available at output latch 38 in the same burst as data being output from the 18 burst multiplexers 32, thus permitting column data and column redundancy data to be tested simultaneously.

Figure 2:
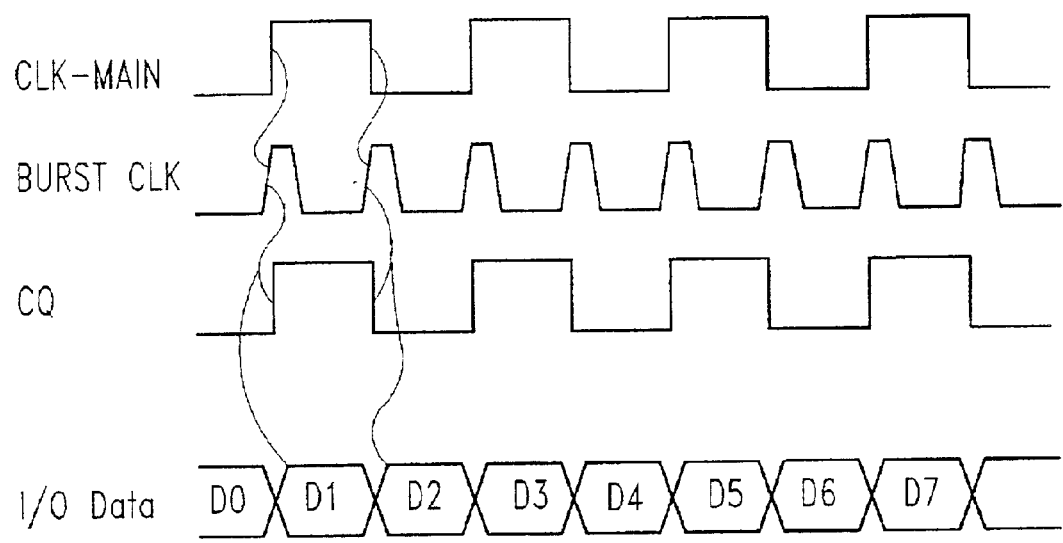
FIG. 2 is a timing diagram illustrating particular signals operative in the preferred embodiment as shown in FIG. 1.
Figure 3:
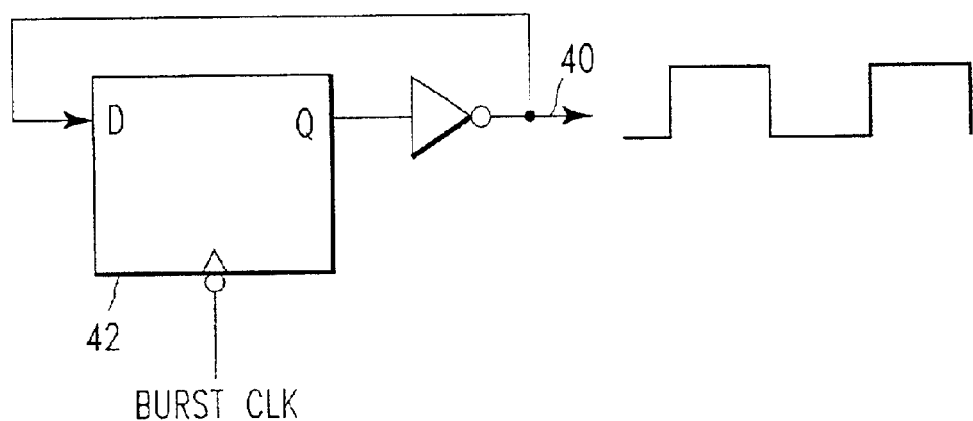
FIG. 3 is a schematic diagram illustrating the generation of a signal operative in the preferred embodiment as shown in FIG. 1.

A particular example describing the generation of the echo-clock signal CQ and burst clock (BURST CLK) from CLK_MAIN is provided now with respect to FIGS. 2 and 3. The main clock signal (CLK_MAIN) is input to circuitry which generates BURST CLK therefrom, a signal which pulses on each rising edge and also on each falling edge of CLK_MAIN. The echo clock CQ is generated from BURST CLK as a regenerated version of CLK_MAIN in the manner as shown in FIG. 2.

BURST CLK allows data to be clocked out from output latches 33 and 38 at twice the rate of CLK_MAIN. The data output from a single output latch 33 or output latch 38 is labeled I/O Data in FIG. 2.

FIG. 3 shows an exemplary circuit for generating a signal (labeled 40) as input to the 2:1 multiplexer 36. The circuit includes a flip-flop 42 connected in a toggle configuration which is latched on the falling edge of the inverted BURST_CLK. In normal operation, the multiplexer 36 passes this signal 40 based on a disabled TEST input thereto. The output latch 38 then clocks the signal out as CQ (the echo clock).

Having thus described the preferred embodiment of the invention with respect to read path circuitry, the operation of the preferred embodiment will now be described particularly with respect to read operations. As described above, in normal operation, data is retrieved from the memory array as the 288 bit output of column redundancy switches 26. In normal operation, the column redundancy switches 22 are set to provide access to the memory array through either regular data lines of groups 25 or through column redundancies 26, after repairs have been made which replace defective data lines with column redundancies 26. These 288 bits are further restricted to 144 bits by the address input Ax (select) to 2:1 multiplexers 30. Then, the 144 bit burst data is output onto the 18 parallel bit input/output data bus I/O-0 . . . I/O-17 as an 8-bit serial burst through the eighteen 8-bit burst multiplexers 32 and the eighteen output latches 33. Thus, in normal operation, only the output of 144 column data paths is provided to data bus I/O-0 . . . I/O-17 during a read access. These 144 column data paths may include both regular data lines from groups 25 and also some column redundancies 26 which stand in place of defective data lines that are no longer used.

In normal operation, no provision is made to output data externally from all of the data lines of groups 25 and from all of the column redundancies 26 simultaneously. In normal operation, an output latch 38 outputs an echo clock signal CQ which is a regenerated version of the main clock (CLK_MAIN) provided to the memory array.

During test mode operation, by contrast, data is output externally from all of the column redundancies 26 at the same time that data is output externally from 144 of the 288 total data lines. Such test mode is expected to be used during production testing of the memory prior to the setting of column redundancy switches 22 for replacement of defective data lines. In such test mode, the column redundancies 26 are exercised and tested simultaneously with the data lines 25 of the memory array. During read access, the output of 144 regular column data paths from groups 25 of data lines is provided to output latches 33 onto data bus I/O-0 . . . I/O-17 while the output of 8 column redundancies is provided to output latch 38 through 8:1 burst multiplexer 34 and 2:1 multiplexer 36, the multiplexer 36 now selecting the column redundancy data with the TEST signal active.

Figure 4:
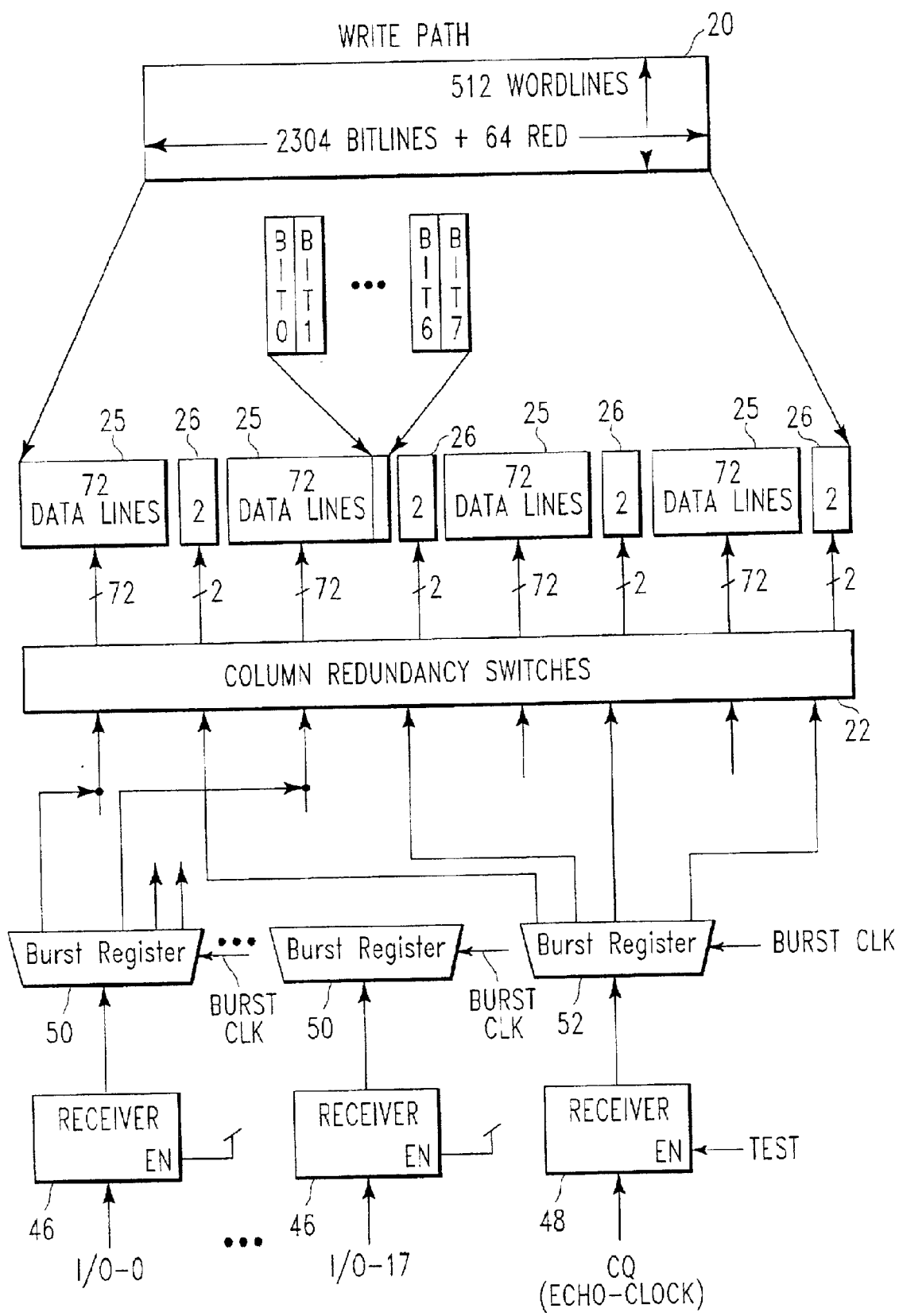
FIG. 4 is a block diagram illustrating a preferred embodiment of the invention, particularly with respect to the exercise of a write path.

FIG. 4 illustrates the preferred embodiment of the invention particularly with respect to the write path. The write path of the preferred embodiment is similar to the read path in the following respects. During normal operation, data is received only from the 18 parallel bit input/output data bus I/O-0 . . . I/O-17, and such data is then provided over 144 column data paths to 144 of the following: regular data lines of groups 25 and to column redundancies 26. Such data is received through 18 regular data bit receivers 46, the output which is stored into eighteen 8-bit burst registers 50. The burst clock (BURST CLK) clocks the received 8-bit serial burst data into the burst registers 50 from the data receivers 46. During normal operation, a special receiver 48 is disabled by an inactive TEST signal. Therefore, in normal operation, no signal is received through receiver 48.

The operation during test mode is as follows. Once again, it is expected that column redundancy switches 22 are set to pass all signals to regular data lines of groups 25 and to column redundancies 26 as the signals are input to the switches 22. Special receiver 48 is enabled by an active TEST signal, which permits an 8-bit serial burst of data to be input through the echo clock (CQ) input thereto. The serial burst is loaded by BURST CLK into burst register 52 and is then available for transfer to column redundancies 26 through column redundancy switches 22.

It will be understood from the foregoing description of the preferred embodiment that the invention provides a way to simultaneously exercise and test column data paths and column redundances of a semiconductor memory by temporarily adding an additional parallel data bit to an n parallel data bit bus, where that additional parallel data bit is ordinarily used for other purposes during normal operation.

While the invention has been described with reference to certain preferred embodiments thereof, those skilled in the art will understand the many modifications and enhancements which can be made without departing from the true scope and spirit of the invention as claimed in the appended claims.

I claim:

1. A method of simultaneously testing columns and column redundancies of a semiconductor memory by temporarily adding an additional parallel signal bit to an input/output data bus associated therewith having n parallel signal bits normally carrying column data, said additional parallel signal bit not normally carrying either column data or column redundancy data.

2. The method of claim 1 wherein said parallel signal bit normally carries a clock signal associated with said semiconductor memory.

3. The method of claim 2 wherein said clock signal is associated with said data bus.

4. The method of claim 1 wherein said n parallel signal bits and said temporarily added parallel signal bit carry column data and column redundancy data during said testing.

5. The method of claim 4 wherein said n parallel signal bits carry column data and said temporarily added parallel signal bit carries column redundancy data during said testing.

6. The method of claim 5 wherein said semiconductor memory is arranged as a memory array normally providing m×n data bit access per transfer between said memory array and said data bus, said method further comprising temporarily providing m×(n+1) data bit access per transfer during said testing.

7. The method of claim 6 wherein said m×n data bit access and said m×(n+1) data bit access are provided as bursts.

8. The method of claim 7 wherein said m×(n+1) data bit access per transfer is provided through n+1 parallel signals each having m burst bits, wherein one of said parallel signals is used only during said testing to provide m burst bit access to said column redundancies.

9. A method of simultaneously testing columns and column redundancies of a semiconductor memory having a memory array, comprising:

normally providing m×n data bit access per transfer between a memory array and a data bus having n parallel signals, each parallel signal having m burst bits each;

temporarily providing m×(n+1) data bit access per transfer during said testing through said n parallel signals and through an added parallel signal having m burst bits to test m additional column redundancies simultaneously with said m×n columns, said added parallel signal normally not having a connection to a data path exterior to said memory array.

10. A system for simultaneously testing columns and column redundancies of a semiconductor memory, said system comprising:

an input/output data bus having n parallel signal bits normally carrying column data;

an additional parallel signal bit normally carrying a signal other than column data or column redundancy data, said additional parallel signal bit adapted to be added temporarily to said input/output data bus during said testing, such that said n parallel signal bits and said additional parallel signal bit provide simultaneous access to column data and column redundancy data for testing.

11. The system of claim 10 wherein said parallel signal bit normally carries a clock signal associated with said semiconductor memory.

12. The system of claim 11 wherein said clock signal is associated with said data bus.

13. The system of claim 10 wherein said n parallel signal bits carry column data and said additional parallel signal bit carries column redundancy data during said testing.

14. The system of claim 13 wherein said semiconductor memory further comprises a plurality n of parallel signals normally carrying column data and an additional parallel signal, said additional parallel signal adapted to transfer said additional parallel signal bit to and from said semiconductor memory during said testing.

15. The system of claim 14 wherein said additional parallel signal is adapted to carry column redundancy data during said testing.

16. The system of claim 15 wherein said additional parallel signal is transported by a burst multiplexer and a burst register, said burst multiplexer and said burst register being connected to said semiconductor memory to provide access between said additional parallel data bit and a plurality of column redundancies.

* * * * *